(12) United States Patent
Momma

(10) Patent No.: US 11,062,747 B2
(45) Date of Patent: Jul. 13, 2021

(54) APPARATUS FOR ADJUSTING DELAY OF COMMAND SIGNAL PATH

(71) Applicant: Micron Technology, Inc., Boise, ID (US)

(72) Inventor: Atsuko Momma, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 353 days.

(21) Appl. No.: 16/143,187

(22) Filed: Sep. 26, 2018

(65) Prior Publication Data

US 2020/0098405 A1  Mar. 26, 2020

(51) Int. Cl.
*G11C 7/22* (2006.01)
*G11C 7/10* (2006.01)

(52) U.S. Cl.
CPC ............ *G11C 7/222* (2013.01); *G11C 7/1087* (2013.01); *G11C 7/225* (2013.01)

(58) Field of Classification Search
CPC ..... G11C 7/1066; G11C 7/1087; G11C 7/109; G11C 7/1093; G11C 7/222; G11C 7/225; G11C 11/4076; G11C 11/4093
See application file for complete search history.

(56) References Cited

U.S. PATENT DOCUMENTS

| 6,188,641 B1* | 2/2001 | Uchida ................ G11C 7/1072 365/189.05 |
| 6,256,260 B1* | 7/2001 | Shim .................... G11C 7/1066 365/189.05 |
| 10,176,858 B1* | 1/2019 | Wilmoth ............. G11C 11/4082 |

FOREIGN PATENT DOCUMENTS

JP  2011146123 A  *  7/2011

* cited by examiner

*Primary Examiner* — Richard Elms
*Assistant Examiner* — R Lance Reidlinger
(74) *Attorney, Agent, or Firm* — Dorsey & Whitney LLP

(57) ABSTRACT

An example apparatus includes a first circuit configured to generate a first enable signal based on a first clock signal and a first command signal, a second circuit configured to generate a second enable signal based on the first clock signal and a second command signal, a third circuit configured to generate a second clock signal based on the first clock signal when the first enable signal is activated, a fourth circuit configured to generate a third clock signal based on the first clock signal when the second enable signal is activated, a first latch circuit configured to latch the second command signal in response to the second clock signal to generate a third command signal, and a second latch circuit configured to latch the third command signal in response to the third clock signal to generate a fourth command signal.

21 Claims, 3 Drawing Sheets

APPARATUS FOR ADJUSTING DELAY OF COMMAND SIGNAL PATH

BACKGROUND

A semiconductor device such as a DRAM receives a command that is synchronous with a clock signal. The external command input to the semiconductor device is decoded by a command decoder, thereby generating an internal command. Because decoding operation of the external command by the command decoder takes a certain length of time, the internal command has a certain length of delay with respect to the clock signal. Therefore, in order to synchronize the internal command with the clock signal, the internal command needs to be latched by using a delayed clock signal. However, if a delayed clock signal is constantly generated, the amount of charge-discharge current is increased. Accordingly, there has been desired a technology for generating a delayed clock signal only in a predetermined period of time.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
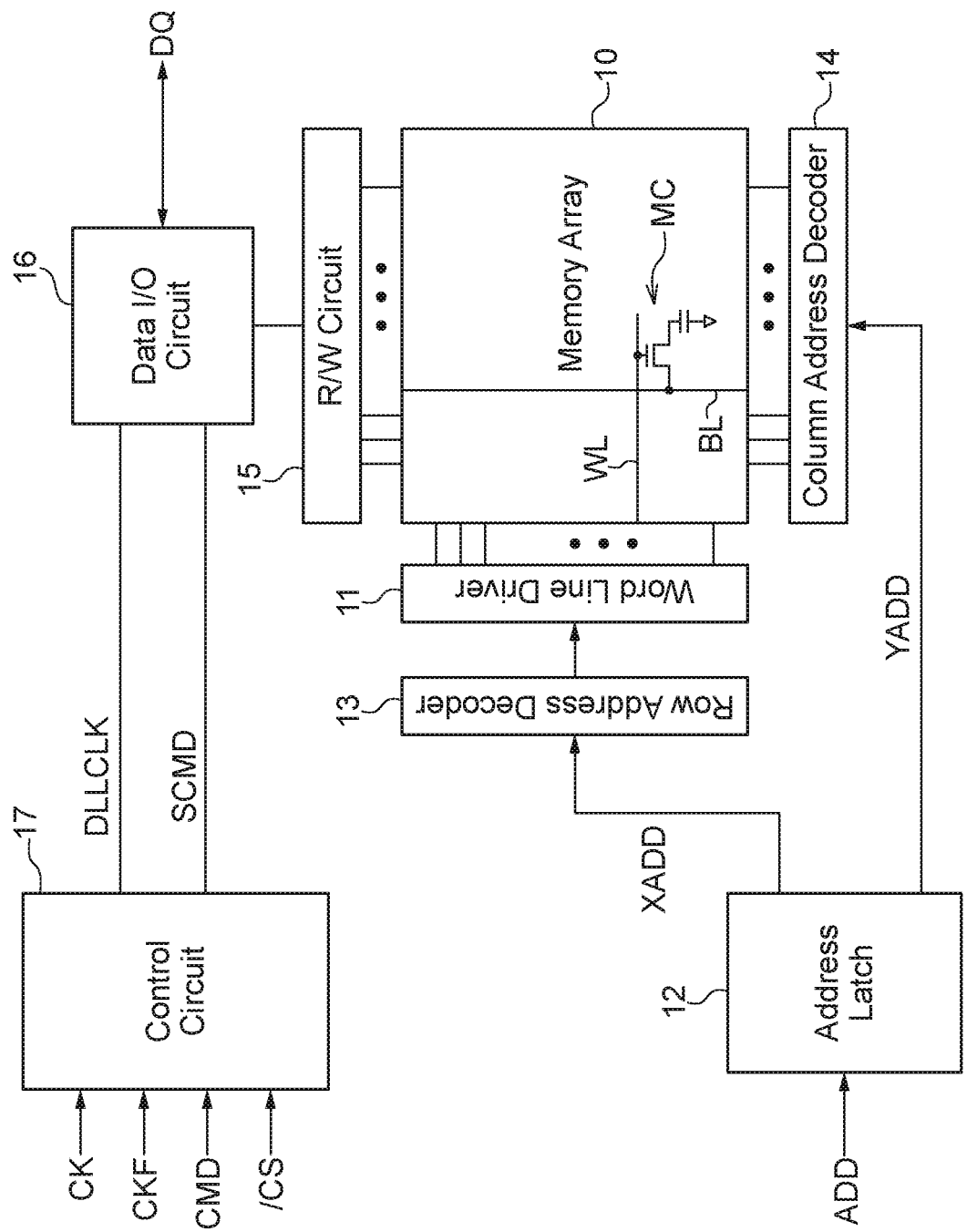
FIG. 1 is a block diagram of a semiconductor device according to the present disclosure.

As shown in FIG. 1, a semiconductor device according to the present disclosure may include a memory cell array 10. The memory cell array 10 may include a plurality of word lines WL driven by a word line driver 11, a plurality of bit lines BL connected to a read/write circuit 15, and a plurality of memory cells MC respectively arranged at intersections of these lines. The semiconductor device includes an address latch circuit 12 that receives external addresses ADD, and among the external addresses ADD latched in the address latch circuit 12, a row address XADD is supplied to a row address decoder 13, and a column address YADD is supplied to a column address decoder 14. The row address decoder 13 selects one or more word lines WL based on the row address XADD. The column address decoder 14 selects one or more bit lines BL based on the column address YADD. The memory cell MC positioned on an intersection of a selected word line WL and a selected bit line BL is connected to a data input/output circuit 16 via the read/write circuit 15. Accordingly, at the time of a read operation, read data DQ read from the memory cell array 10 is output from the data input/output circuit 16 to outside.

Operations of the data input/output circuit 16 are controlled by a control circuit 17. The control circuit 17 may receive external clock signals CK and CKF, an external command CMD, and a chip select signal /CS, and may generate an internal clock signal DLLCLK and an internal command SCMD. The internal clock signal DLLCLK and the internal command SCMD are supplied to the data input/output circuit 16. It is also possible that the control circuit 17 controls operations of other constituent elements such as the word line driver 11, the row address decoder 13, the column address decoder 14, and the read/write circuit 15.

Figure 2:
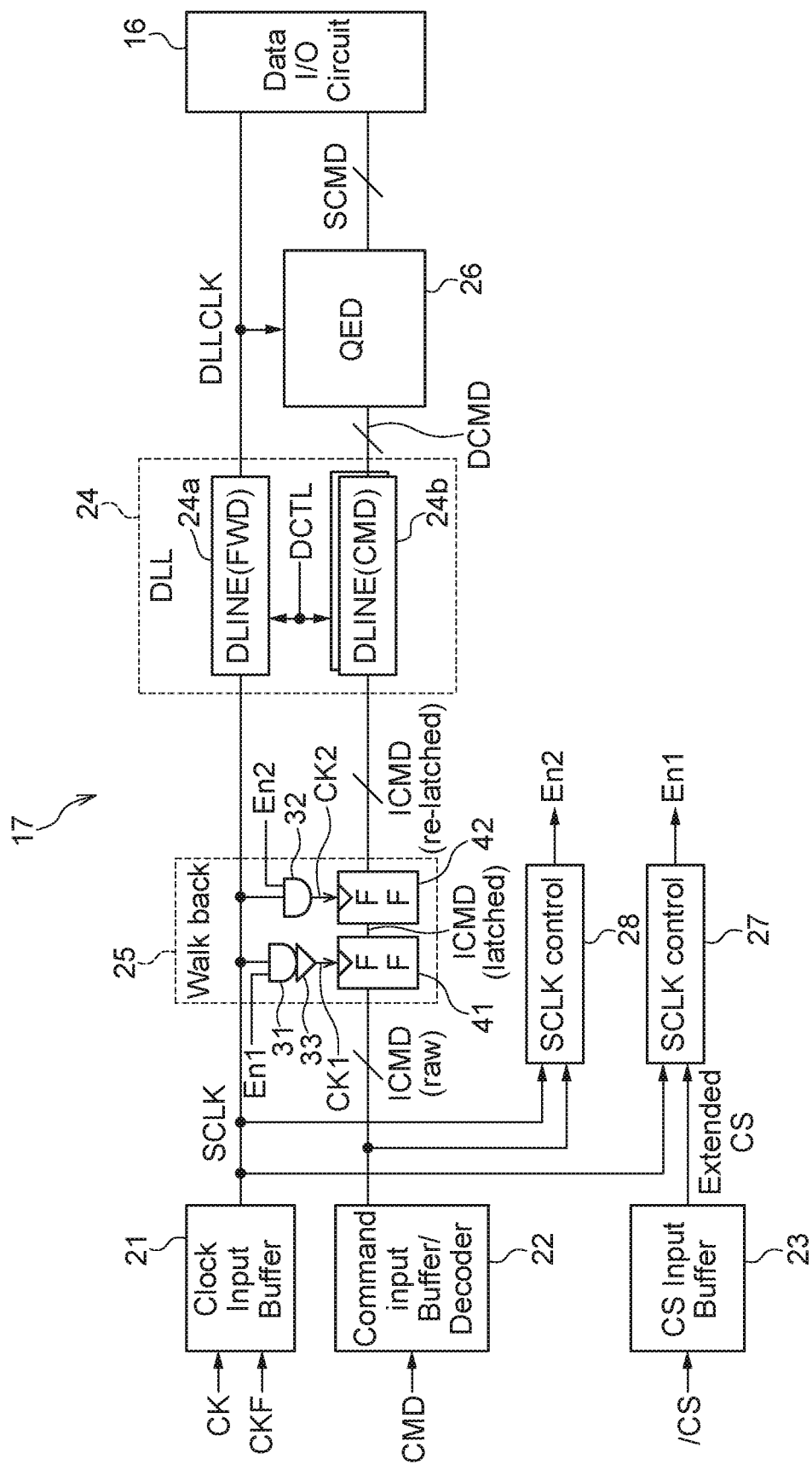
FIG. 2 is a block diagram of a control circuit according to the present disclosure.

As shown in FIG. 2, the control circuit 17 may include a clock input buffer 21, a command input buffer/decoder 22, and a CS input buffer 23. The dock input buffer 21 receives complementary external clock signals CK and CKF and generates a system clock signal SCLK. The system clock signal SCLK is supplied to a delay line 24a included in a DLL circuit 24. The delay line 24a delays the system dock signal SCLK based on a delay control signal DCTL. The system clock signal SCLK delayed by the delay line 24a is output as the internal clock signal DLLCLK and is supplied to the data input/output circuit 16. When the internal command SCMD indicates a read operation, the data input/output circuit 16 outputs the data DQ read from the memory cell array 10 to outside while synchronizing the data DQ with the internal clock signal DLLCLK.

Upon reception of the external command CMD and decoding the received external command CMD, the command input buffer/decoder 22 generates an extended internal command ICMD. That is, the command input buffer/decoder 22 has a command extension function. The state length of the extended internal command ICMD is set to be the same as the burst length thereof. With this setting, when a column command is input to the semiconductor device continuously with the shortest cycle, the internal command ICMD does not change its state while maintaining to be activated, and thus the amount of charge-discharge current is reduced.

The external command CMD is input to the semiconductor device while being synchronized with complementary external clock signals CK and CKF. A decoding operation on the external command CMD by the command input buffer/decoder 22 requires a certain length of time, and thus the internal command ICMD has a certain length of delay with respect to the system clock signal SCLK. The internal command ICMD is timing-adjusted by a walk back circuit 25, thereby generating an internal command ICMD (re-latched). The internal command ICMD (re-latched) is supplied to a delay line 24b included in the DLL circuit 24. The delay line 24b delays the internal command ICMD (re-latched) based on the delay control signal DCTL. The delay amount of the delay line 24b is the same as the delay amount of the delay line 24a. The internal command ICMD (re-latched) delayed by the delay line 24b is output as an internal command DCMD. The internal command DCMD is supplied to a delay circuit 26 and a predetermined latency is given thereto. The internal command SCMD output from the delay circuit 26 is supplied to the data input/output circuit 16. Upon reception of the chip select signal /CS and latching the received chip select signal /CS therein, the CS input buffer 23 generates an extended internal chip select signal CS.

The control circuit 17 further includes enable signal generation circuits 27 and 28. The enable signal generation circuit 27 receives the system clock signal SCLK and the extended internal chip select signal CS and generates an enable signal En1 based on these signals. The enable signal generation circuit 28 receives the system clock signal SCLK and the extended internal command ICMD and generates an enable signal En2 based on these signals. The enable signal En1 and the system clock signal SCLK are input to an AND gate circuit 31 included in the walk back circuit 25. The enable signal En2 and the system clock signal SCLK are input to an AND gate circuit 32 included in the walk back circuit 25. The output of the AND gate circuit 31 is used as an internal clock signal CK1 via a delay element 33. The internal clock signal CK1 is supplied to a clock node of a latch circuit 41. Further, the output of the AND gate circuit 32 is used as an internal clock signal CK2. The internal clock signal CK2 is supplied to a clock node of a latch circuit 42.

The latch circuits 41 and 42 are cascade-connected to each other. The latch circuit 41 latches an internal command ICMD (raw) and outputs an internal command ICMD (latched). The latch circuit 42 latches the internal command ICMD (latched) and outputs an internal command ICMD (re-latched). The internal command ICMD (re-latched) is supplied to the DLL circuit 24.

Figure 3:
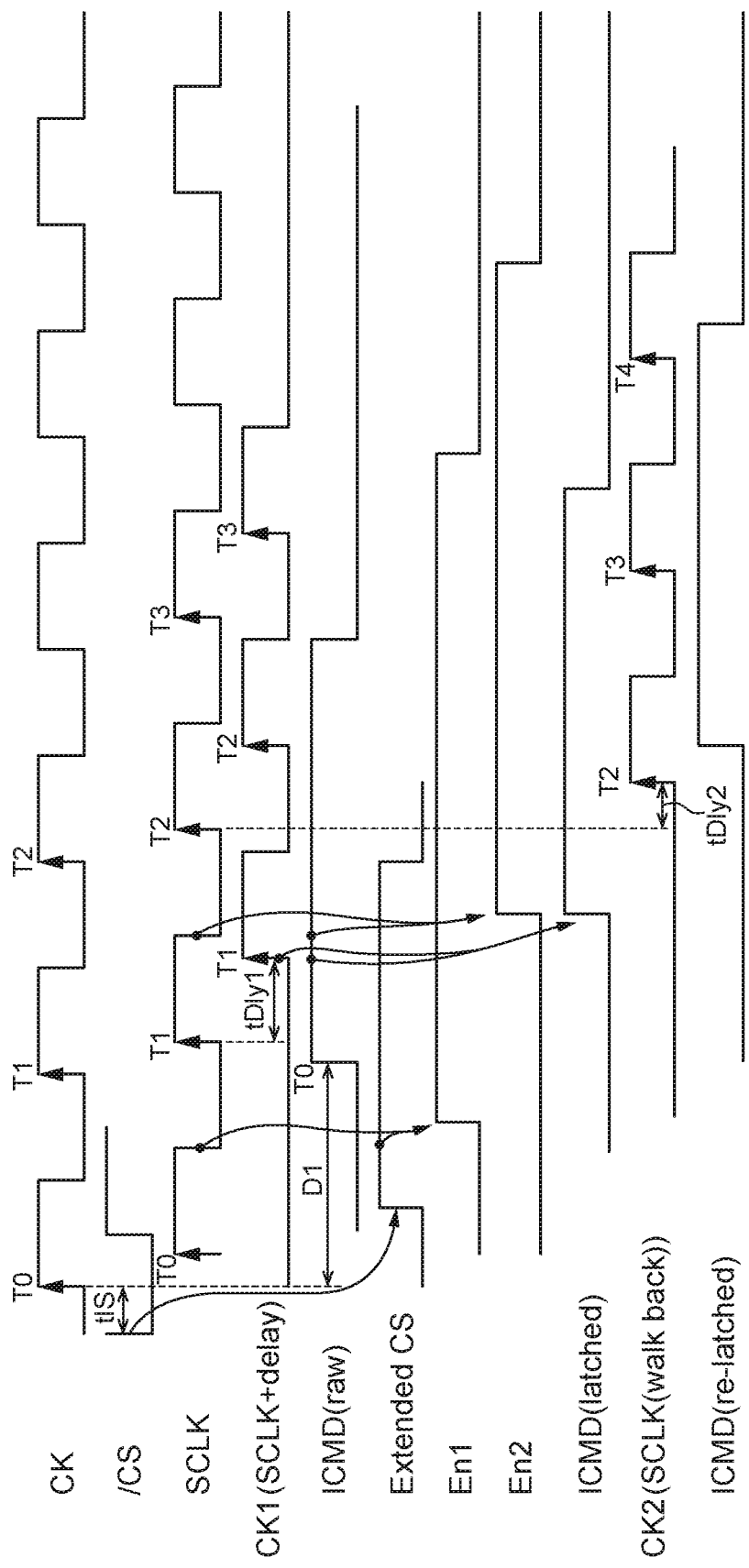
FIG. 3 is a timing chart for explaining an operation of the control circuit shown in FIG. 2.

Next, operations of the control circuit 17 are described. In the example shown in FIG. 3, the external command CMD is input to the semiconductor device while the external command CMD is synchronized with a rising edge T0 of the external clock signal CK. As described above, because a certain length of time is required for generating the internal command ICMD (raw) by decoding the external command CMD, the internal command ICMD (raw) is activated at a timing delayed for a delay time D1 from the rising edge T0 of the external clock signal CK. At this time, the chip select signal /CS is activated from a high level to a low level at a timing earlier than the rising edge T0 of the external clock signal CK for a set-up time tIS. Therefore, the timing when the extended internal chip select signal CS is activated is sufficiently earlier than the timing when the internal command ICMD (raw) is activated. Although the timing when the extended internal chip select signal CS is activated is late for the rising edge T0 of the system clock signal SCLK, the timing is early enough for a falling edge subsequent to the rising edge T0 of the system clock signal SCLK.

When the extended internal chip select signal CS is activated at a high level, the enable signal generation circuit 27 activates the enable signal En1 at a high level while synchronizing the enable signal En1 with the falling edge of the system clock signal SCLK. When the enable signal En1 is activated at a high level, clocking of the internal clock signal CK1 is started. The internal clock signal CK1 is delayed with respect to the system clock signal SCLK for a delay time tDly1. The delay time tDly1 is caused mainly by the delay element 33. In this manner, because the internal clock signal CK1 is delayed with respect to the system clock signal SCLK for the delay time tDly1, the latch circuit 41 can securely latch the internal command ICMD (raw) therein. The internal command ICMD (raw) latched in the latch circuit 41 is output as the internal command ICMD (latched).

When the internal command ICMD (raw) is activated at a high level, the enable signal generation circuit 28 activates the enable signal En2 at a high level while synchronizing the enable signal En2 with the falling edge of the system clock signal SCLK. When the enable signal En2 is activated at a high level, clocking of the internal clock signal CK2 is started. The internal clock signal CK2 is delayed with respect to the system clock signal SCLK for a delay time tDly2. The delay time tDly2 is a delay component caused by the AND gate circuit 32 and is sufficiently shorter than the delay time tDly1. The internal command ICMD (latched) latched in the latch circuit 42 is output as the internal command ICMD (re-latched). As described above, the delay time tDly2 is a minute delay component caused by the AND gate circuit 32 and is substantially synchronous with the system clock signal SCLK. Therefore, the internal command ICMD (re-latched) output from the latch circuit 42 is substantially synchronous with the system clock signal SCLK. As a result, when the external command CMD is input to the semiconductor device while being synchronized with the rising edge T0 of the external clock signal CK, an internal command ICMD (re-latched) being synchronized with a rising edge T2 of the system clock signal SCLK is generated.

After the same delay as that of the system clock signal SCLK is given to the internal command ICMD (re-latched) by the DLL circuit 24, a predetermined latency is given thereto by the delay circuit 26 and then the internal command ICMD (re-latched) is supplied to the data input/output circuit 16. With this operation, when the external command CMD indicates a read operation, the data DQ read from the memory cell array 10 is, after the predetermined latency has elapsed, synchronized with the internal clock signal DLLCLK and output to outside.

In the present embodiment, the chip select signal /CS that is activated earlier than the rising edge T0 of the external clock signal CK for the set-up time tIS is used and the enable signal En1 is generated based on the chip select signal /CS. Therefore, the enable signal En1 is activated earlier than the internal command ICMD (raw). Accordingly, because docking of the internal clock signal CK1 can be controlled based on the enable signal En1, docking of the internal clock signal CK1 can be made only when the external command CMD is issued and clocking of the internal clock signal CK1 can be stopped during a period where the external command CMD is not issued. With this configuration, as compared to a case where the internal clock signal CK1 is constantly clocked, it is possible to reduce the amount of charge-discharge current.

It is noted that for example, specific example of FIG. 2 is disclosed in U.S. Pat. No. 9,997,220 (U.S. application Ser. No. 15/243,651). The disclosure of the Patent is incorporated herein in their entirety by reference thereto.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:
1. An apparatus comprising:
a first circuit configured to generate a first enable signal based on a first clock signal and a first command signal;
a second circuit configured to generate a second enable signal based on the first clock signal and a second command signal;
a third circuit configured to generate a second clock signal based on the first clock signal when the first enable signal is activated, a delay amount between the first clock signal and the second clock signal being a first time;

a fourth circuit configured to generate a third clock signal based on the first clock signal when the second enable signal is activated, a delay amount between the first clock signal and the third clock signal being a second time that is shorter than the first time;

a first latch circuit configured to latch the second command signal in response to the second clock signal to generate a third command signal; and a second latch circuit configured to latch the third command signal in response to the third clock signal to generate a fourth command signal.

2. The apparatus of claim 1, wherein the first circuit is configured to activate the first enable signal over a plurality of cycles of the first clock signal so that the first latch circuit receives a plurality of active edges of the second clock signal in response to the first command signal.

3. The apparatus of claim 2, wherein the second circuit is configured to activate the second enable signal over a plurality of cycles of the first clock signal so that the second latch circuit receives a plurality of active edges of the third clock signal in response to the second command signal.

4. The apparatus of claim 1, wherein the first command signal comprises a chip select signal.

5. The apparatus of claim 1, wherein the second command signal comprises at least one of a read command and a write command.

6. The apparatus of claim 1, further comprising:
a first delay line through which the first clock signal passes; and
a second delay line through which the fourth command signal passes.

7. The apparatus of claim 6, wherein the second delay line has substantially a same delay amount as the first delay line.

8. The apparatus of claim 1, further comprising a clock input buffer circuit configured to generate the first clock signal based on an external clock signal.

9. The apparatus of claim 8, further comprising a command decoder circuit configured to generate the second command signal by decoding an external command signal synchronized with the external clock signal.

10. The apparatus of claim 1, wherein the third circuit includes a delay element delaying the first clock signal to generate the second clock signal.

11. An apparatus comprising:
a clock input buffer circuit configured to generate a first clock signal based on an external clock signal;
a command decoder circuit configured to generate a first command signal by decoding an external command signal synchronized with the external clock signal;
a first clock control circuit configured to generate a second clock signal that is delayed from the first clock signal in a first delay amount;
a second clock control circuit configured to generate a third clock signal that is delayed from the first clock signal in a second delay amount;
a first latch circuit configured to latch the first command signal in response to the second clock signal to generate a second command signal; and
a second latch circuit configured to latch the second command signal in response to the third clock signal to generate a third command signal,
wherein the first clock control circuits stops generating the second clock signal when a first enable signal is deactivated, and wherein the second clock control circuit stops generating the third clock signal when a second enable signal different from the first enable signal is deactivated.

12. The apparatus of claim 11, wherein the first delay amount s greater than the second delay amount.

13. The apparatus of claim 12, wherein the first enable signal is activated before the second enable signal is activated.

14. The apparatus of claim 13, wherein the first enable signal is deactivated before the second enable signal is deactivated.

15. The apparatus of claim 14, wherein both the first and second enable signals are in an active state during a predetermined period.

16. The apparatus of claim 11, further comprising:
a first delay line through which the first clock signal passes; and
a second delay line through which the third command signal passes.

17. The apparatus of claim 16, wherein the second delay line has substantially a same delay amount as the first delay line.

18. An apparatus comprising:
a first delay line configured to receive a first clock signal;
a first latch circuit configured to latch a first command signal in response to a second clock signal to generate a second command signal;
a second latch circuit configured to latch the second command signal in response to a third clock signal to generate a third command signal;
a second delay line configured to receive the third command signal;
a first clock control circuit configured to generate the second clock signal; and
a second clock control circuit configured to generate the third clock signal,
wherein the first clock control circuit is activated before the second clock control circuit is activated, and
wherein the first clock control circuit is deactivated before the second clock control circuit is deactivated.

19. The apparatus of claim 18, wherein a phase difference between the first and second clock signals is greater than a phase difference between the first and third clock signals.

20. The apparatus of claim 18, wherein the second delay line has substantially a same delay amount as the first delay line.

21. An apparatus comprising:
a clock control circuit configured to receive a first clock signal and output a second clock signal responsive to an enable signal;
a latch circuit configured to latch a command signal responsive to the second clock signal;
a circuit configured to produce the enable signal responsive to a chip select signal and the first clock signal;
an additional latch circuit configured to latch a command signal output from the latch circuit responsive to a third clock signal;
an additional clock control circuit configured to receive the first clock signal and output the third clock signal responsive to a second enable signal; and
an additional circuit configured to produce the second enable signal responsive to the command signal and the first clock signal.

* * * * *